United States Patent [19]

Harris et al.

[11] Patent Number: 4,804,723

[45] Date of Patent: Feb. 14, 1989

[54] MISCIBLE BLENDS OF POLY(ARYL ETHER SULFONES)

[75] Inventors: James E. Harris, Piscataway, N.J.; Lloyd M. Robeson, Macungie, Pa.

[73] Assignee: Amoco Corporation, Chicago, Ill.

[21] Appl. No.: 101,260

[22] Filed: Sep. 25, 1987

Related U.S. Application Data

[63] Continuation-in-part of Ser. No. 887,894, Jul. 28, 1986, abandoned, which is a continuation-in-part of Ser. No. 766,692, Aug. 19, 1985, abandoned.

[51] Int. Cl.$^4$ ............................................. C08F 283/00
[52] U.S. Cl. ...................................... 525/535; 525/534
[58] Field of Search ................................ 525/534, 535

[56] References Cited

U.S. PATENT DOCUMENTS 4,503,168  3/1985  Hartsing, Jr. ...................... 523/100
4,520,067  5/1985  Harris et al. ....................... 428/323

Primary Examiner—Melvyn I. Marquis
Attorney, Agent, or Firm—Donald M. Papuga; William H. Magidson; Ralph C. Medhurst

[57] ABSTRACT

Described herein are miscible blends of select poly(aryl ether sulfones). These blends are suitable for printed wiring board substrates, flexible printed circuit boards, electrical connectors and fabricated articles requiring high heat and chemical resistance, and good dimensional and hydrolytic stability.

15 Claims, 3 Drawing Sheets

SHADED AREA DEPICTS STRUCTURE OF PAEs THAT ARE MISCIBLE WITH PAE I

Tg vs COMPOSITION FOR PAE II/PAE V BLENDS

SHADED AREA DEPICTS STRUCTURE OF PAEs THAT ARE MISCIBLE WITH PAE II

SHADED AREA DEPICTS STRUCTURE OF PAEs THAT ARE MISCIBLE WITH PAE III

MISCIBLE BLENDS OF POLY(ARYL ETHER SULFONES)

REFERENCE TO RELATED APPLICATION

This application is a continuation-in-part application of Ser. No. 887,894, filed July 28, 1986, which, in turn, is a continuation-in-part application of Ser. No. 766,692, filed Aug. 19, 1985, both now abandoned.

FIELD OF THE INVENTION

This invention is directed to miscible blends of different poly(aryl ether sulfones). These blends are suitable for printed wiring board substrates, flexible printed circuit boards, electrical connectors and other fabricated articles requiring high heat and chemical resistance, and good dimensional and hydrolytic stability.

BACKGROUND OF THE INVENTION

Over the years, there has been developed a substantial body of patent and other literature directed to the formation and properties of poly(aryl ethers) (hereinafter called "PAE"). Some of the earliest work such as by Bonner, U.S. Pat. No. 3,065,205, involves the electrophilic aromatic substitution (viz. Friedel-Crafts catalyzed) reaction of aromatic diacylhalides with unsubstituted aromatic compounds such as diphenyl ether. The evolution of this class to a much broader range of PAEs was achieved by Johnson, et al., Journal of Polymer Science, A-1, vol. 5, 1967, pp. 2415-2427; Johnson, et al., U.S. Pat. Nos. 4,108,837; and 4,175,175. Johnson, et al., show that a very broad range of PAE can be formed by the nucleophilic aromatic substitution (condensation) reaction of an activated aromatic dihalide and an aromatic diol.

Thus, PAEs are well known; they can be made from a variety of starting materials, and they can be made with different glass transition temperatures and molecular weights. Nominally, PAEs are transparent and tough, i.e., exhibit high values ($>50$ ft-lbs/in$^2$) in the tensile impact test (ASTM D-1822). Their favorable properties class them with the best of the engineering polymers.

Polymer blends have been widely taught and employed in the art. As broad as this statement may be, the blending of polymers remains an empirical art and the selection of polymers for a blend giving special properties is, in the main, an Edisonian-like choice. Certain attributes of polymer blends are more unique than others. The more unique attributes when found in a blend tend to be unanticipated properties.

(a) According to Zoller and Hoehn, Journal of Polymer Science, Polymer Plastics Edition, vol. 20, pp. 1385-1397 (1982):

"Blending of polymers is a useful technique to obtain properties in thermoplastic materials not readily achieved in a single polymer. Virtually all technologically important properties can be improved in this way, some of the more important ones being flow properties, mechanical properties (especially impact strength), thermal stability, and price.

\*\*\*

... Ultimately, the goal of such modeling and correlation studies should be the prediction of blend properties from the properties of the pure components alone. We are certainly very far from achieving this goal."

In the field of miscibility or compatibility of polymer blends, the art has found predictability to be unattainable, even though considerable work on the matter has been done. According to authorities:

(b)

"It is well known that compatible polymer blends are rare."

Wang and Cooper, Journal of Polymer Science, Polymer Physics Edition, vol. 21, p. 11 (1983).

(c)

"Miscibility in polymer-polymer blends is a subject of widespread theoretical as well as practical interest currently. In the past decade or so the number of blend systems that are known to be miscible has increased considerably. Moreover, a number of systems have been found that exhibit upper or lower critical solution temperatures, i.e., complete miscibility only in limited temperature ranges. Modern thermodynamic theories have had limited success to date in predicting miscibility behavior in detail. These limitations have spawned a degree of pessimism regarding the likelihood that any practical theory can be developed that can accommodate the real complexities that nature has bestowed on polymer-polymer interactions."

Kambour, Bendler, Bopp, Macromolecules, 1983, 16, 753.

(d)

"The vast majority of polymer pairs form two-phase blends after mixing as can be surmised from the small entropy of mixing for very large molecules. These blends are generally characterized by opacity, distinct thermal transitions, and poor mechanical properties. However, special precautions in the preparation of two-phase blends can yield composites with superior mechanical properties. These materials play a major role in the polymer industry, in several instances commanding a larger market than either of the pure components."

Olabisi, Robeson and Shaw, Polymer-Polymer Miscibility, 1979, published by Academic Press, New York, N.Y., p. 7.

(e)

"It is well known that, regarding the mixing of thermoplastic polymers, incompatibility is the rule and miscibility and even partial miscibility is the exception. Since most thermoplastic polymers are immiscible in other thermoplastic polymers, the discovery of a homogeneous mixture or partially miscible mixture of two or more thermoplastic polymers is, indeed, inherently unpredictable with any degree of certainty, for example, see P. J. Flory, Principles of Polymer Chemistry, Cornell University Press, 1953, Chapter 13, page 555."

Younes, U.S. Pat. No. 4,371,672.

(f)

"The study of polymer blends has assumed an ever increasing importance in recent years and the resulting research effort has led to the discovery of a number of miscible polymer combinations. Complete miscibility is an unusual property in binary polymer mixtures which normally tend to form phase-separated systems. Much of the work has been of a qualitative nature, however, and variables such as molecular weight and conditions of blend preparation have often been overlooked. The criteria for establishing miscibility are also varied and may not always all be applicable to particular systems."

Saeki, Cowie and McEwen, Polymer, 1983, vol. 24, January, p. 60.

Miscible polymer blends are not common, and those of different PAEs are unique to most uncommon.

The criteria for determining whether or not two polymers are miscible is now well established. According to Olabisi, et al., Polymer-Polymer Miscibility, 1979, published by Academic Press, New York, N.Y., p. 120:

"The most commonly used method for establishing miscibility in polymer-polymer blends or partial phase mixing in such blends is through determination of the glass transition (or transitions) in the blend versus those of the unblended constituents. A miscible polymer blend will exhibit a single glass transition between the Tgs of the components with a sharpness of the transition similar to that of the components. In cases of borderline miscibility, broadening of the transition will occur. With cases of limited miscibility, two separate transitions between those of the constituents may result, depicting a component 1-rich phase and a component 2-rich phase. In cases where strong specific interactions occur, the Tg may go through a maximum as a function of concentration. The basic limitation of the utility of glass transition determinations in ascertaining polymer-polymer miscibility exists with blends composed of components which have equal or similar ($<20°$ C. difference) Tgs, whereby resolution by the techniques to be discussed of two Tgs is not possible."

W. J. MacKnight, et al., in Polymer Blends, D. R. Paul and S. Newman, eds., 1978, published by Academic Press, New York, N.Y., state on page 188:

"Perhaps the most unambiguous criterion of polymer compatibility is the detection of a single glass transition whose temperature is intermediate between those corresponding to the two component polymers."

In this passage, it is clear from the omitted text that by compatibility the authors mean miscibility, i.e., single phase behavior. See for example the discussion in Chapter 1 by D. R. Paul in the same work.

Although it is clear from the above passages that polymer miscibility cannot be predicted, there is recent evidence that once several examples are found where polymers of a class 1 are miscible with polymers of a class 2, then the phase behavior of blends of polymers of class 1 and polymers of class 2 can be correlated with structure. The net result is that a mathematical inequality can be written which correctly predicts when other polymers chosen from class 1 and class 2 are miscible. There is evidence that the miscibility of two polymers composed of several different types of mer units can be correlated by an equation of the type $$F_c > \sum_i \sum_{j>i} (\phi_i^1 \phi_j^2 + \phi_i^2 \phi_j^1 - \phi_i^1 \phi_j^1 - \phi_i^2 \phi_j^2) B_{ij} \quad (1)$$

where $F_c$ is a small positive number (or zero), the $\phi_i^K$ are related to the number of mers of type i in polymer K, and the $B_{ij}$ represent the interaction energy between mers of type i and j. For example, in Paul, et al., Polymer 25, pp. 487–494 (1984), the miscibility of the polyhydroxy ether of bisphenol A is successfully correlated with a series of aliphatic polyesters using (equation 10 in the above reference)

$$0 > B_{13}\phi_1' + B_{23}\phi_2' - B_{12}\phi_1'\phi_2' \quad (2)$$

Equation (2) is equivalent to equation (1) if the following change of notation is made:

$F_c = 0$
$\phi_{1'} = \phi_1^1$
$\phi_{2'} = \phi_2^1$
$\phi_3^2 = 1$
and all other $\phi_i^K = 0$.

In this case, the $\phi_i^K$ are taken to be the volume fraction mer i in polymer K. The $B_{ij}$ were essentially taken as adjustable parameters representing the enthalpy of interaction between group i and j. Paul and coworkers considered the polymer blend system to be made up of three groups:

(1) —CH$_2$—
  and
(2)

which make up the aliphatic polyesters, and
(3)

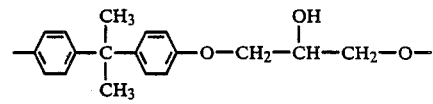

which make up the polyhydroxy ether.

Kambour, et al., (Macromolecules, 16, pp. 753–757 (1983)) used a similar equation to correlate the miscibility of poly(styrene-co-bromostyrene) with poly(xylenyl co-bromoxylenyl ether). In the case where polymer 1 contained only mers of type i and polymer 2 contained mers of type j and K, the condition of miscibility that was arrived at was (see equation 4 on page 756 of the above cited work):

$$\chi_{AB}^C > (1 - \bar{x}_c)\chi_{ij} + \bar{x}_c \chi_{ik} - \bar{x}_c(1 - \bar{x}_c)\chi_{kj} \quad (3)$$

Note the mistake in the third term of equation 4 in Kambour, et al., which is corrected in equation (3) above. Equation (3) is seen to be identical with equation (1) if the following change of notation is made:
$F_c = \chi_{AB}^C$
$\bar{x}_c = \phi_j^2$ $(1-\bar{\chi}_c) = \phi_k^2$
$\phi_i^1 = 1$
All other $\phi_i^K = 0$.
$\chi_{ij} = B_{ij}$ for all i & j.

In this instance, Kambour has taken the $\phi_i^K$ to be the mole fraction mer i in polymer K. Again the $B_{ij}$ were taken to be adjustable parameters.

There is a precedent, then, for correlating miscibility using equation (1). We have seen that the $\phi$ may be interpreted as volume fractions or mole fractions. Prausnitz, et al., in the Properties of Gases and Liquids, Third Edition, published by McGraw-Hill Book Co., New York, N.Y. (1977), recommend the use of molecular area fractions in equations similar to equation (1) (see Chapter 8 in Prausnitz, et al.). They recommend the use of the group contribution method developed by A. Bondi in the Physical Properties of Molecular Liquids, Crystals and Glasses, Chapter 14, published by John Wiley and Sons, New York, N.Y. (1968), for the estimation of the surface area of mer units.

DESCRIPTION OF THE INVENTION

It has now been found that several poly(aryl ether sulfones) are miscible with each other. The miscible blend comprises separately made different poly(aryl ether sulfones) formed into an intimate moldable mixture, each resin comprising 1,4-arylene units separated by ether oxygen and each resin containing a 1,4-arylene unit separated by an $SO_2$ radical. The 1,4 arylene units preferably being 1,4-phenylene or 1,4-biphenylene units.

The miscible poly(aryl ether sulfone) blends are made up of two or more different poly(aryl ether sulfones) consisting essentially of at least one unit selected from the group consisting of:

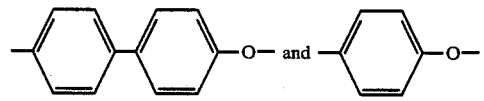

and at least one unit selected from the group consisting of:

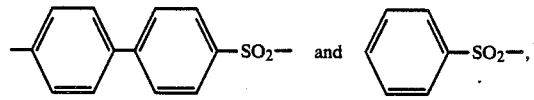

the poly(aryl ether sulfones) being different and each comprises the following radicals:

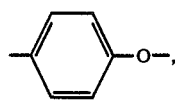 (I)

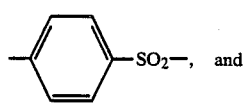 (II)

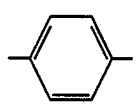 (III)

They are miscible if:

$$(\phi_1^1\phi_2^2 + \phi_1^2\phi_2^1 - \phi_1^1\phi_2^1 - \phi_1^2\phi_2^2)25.2 + \qquad (4)$$
$$(\phi_1^1\phi_3^2 + \phi_1^2\phi_3^1 - \phi_1^1\phi_3^1 - \phi_1^2\phi_3^2)14.3 +$$
$$(\phi_2^1\phi_3^2 + \phi_2^2\phi_3^1 - \phi_2^1\phi_3^1 - \phi_2^2\phi_3^2)32.8 \leq 1$$

Where $$\phi_1^1 = \frac{X_1}{X_1 + 1.415X_2 + 0.927X_3}$$

$$\phi_1^2 = \frac{Y_1}{Y_1 + 1.415Y_2 + 0.927Y_3}$$

$$\phi_2^1 = \frac{1.415X_2}{X_1 + 1.415X_2 + 0.927X_3}$$

$$\phi_2^2 = \frac{1.415Y_2}{Y_1 + 1.415Y_2 + 0.927Y_3}$$

$$\phi_3^1 = \frac{0.927X_3}{X_1 + 1.415X_2 + 0.927X_3}$$

$$\phi_3^2 = \frac{0.927Y_3}{Y_1 + 1.415Y_2 + 0.927Y_3}$$

$X_1$ is the molar fraction of

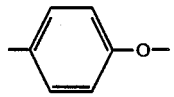

radicals in polyarylether sulfone 1
$X_2$ is the molar fraction of

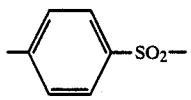

radicals in polyarylether sulfone 1
$X_3$ is the molar fraction of

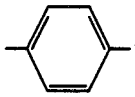

radicals in polyarylether sulfone 1
$Y_1$ is the molar fraction of

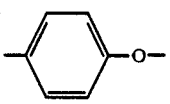

radicals in polyarylether sulfone 2
$Y_2$ is the molar fraction of

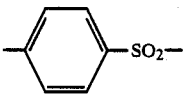

radicals in polyarylether sulfone 2

$Y_3$ is the molar fraction of

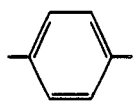

radicals in polyarylether sulfone 2

The miscible blends defined by the above relationship have single Tg's lying between those of the two constituents and are transparent with the proviso that the constituents are transparent. The blends are totally miscible in that they have a single Tg. The utility of such blends are without question very broad; see for example Olabisi, et al., in Polymer-Polymer Miscibility, Chapter 7, Published by Academic Press, New York, N.Y., pp. 321-353. In particular, such blends would be useful for printed wiring board substrates, flexible printed circuit boards, electrical connectors and other fabricated articles requiring high heat and chemical resistance, and good dimensional and hydrolytic stability.

The poly(aryl ether sulfones) of this invention consist essentially of at least one unit selected from the group consisting of:

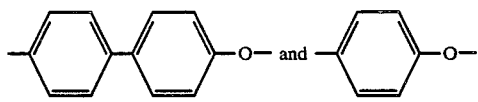

and at least one unit selected from the group consisting of:

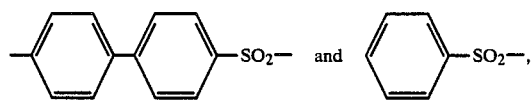

the poly (aryl ether sulfones) being different and each comprises the following radicals:

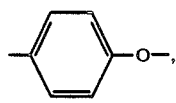
(I)

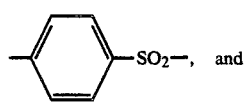
(II)

and

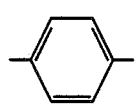
(III)

The poly(aryl ether sulfones) are different since their repeating units have different proportions of radicals (I), (II) and (III), or different arrangements thereof. In the case of copolymers, the polymers may differ in the proportions of radicals (I), (II), and (III). The aryl groups represented by formulas (I), (II), and (III), can be attached to each other as will be seen in the structural formulas in the polymers below.

THE FIGURES

FIG. 1 shows a curve of the glass transition temperature (Tg) versus a composition of PAE II/PAE V blends (as are hereinafter structurally depicted).

FIG. 2 depicts, in the shaded area, the region specified by equation 4 when polymer 1 is PAE I and polymer 2 contains the radicals I, II, III.

FIGS. 3, 4, and 5, depict the region specified by equation 4 when polymer 1 is PAE II, PAE III and PAE IV, respectively.

DETAILED DESCRIPTION OF THE INVENTION

Figure 2:
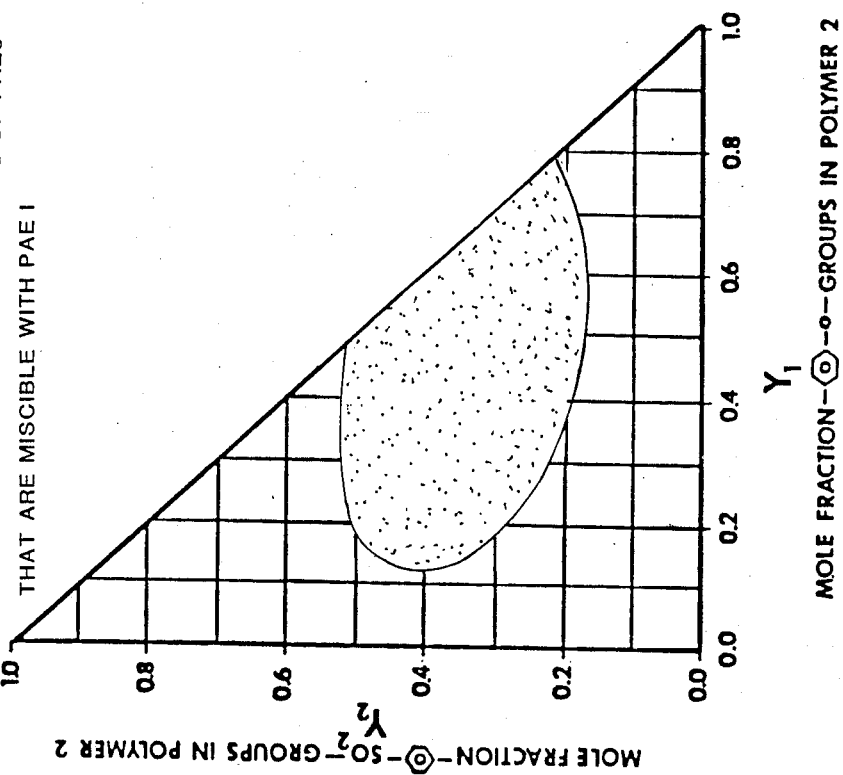
Figure 1:
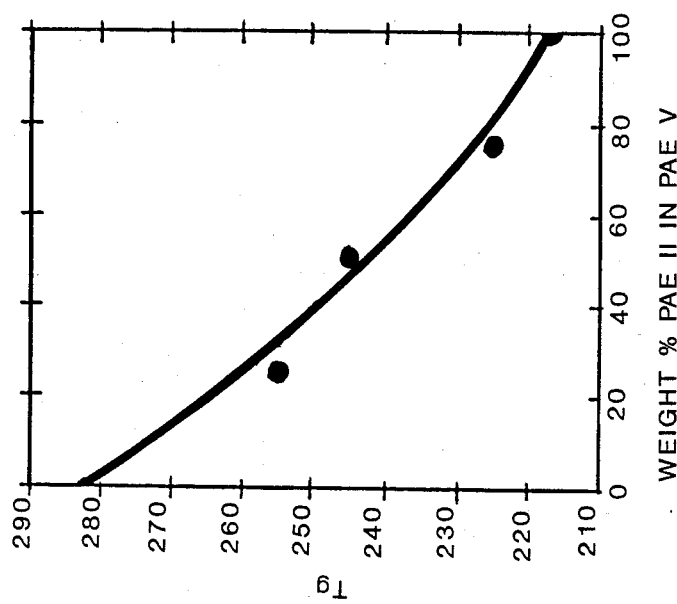

The poly(aryl ether sulfone) polymers which are used in the miscible blends are prepared by methods well known in the art.

The monomers which are utilized to prepare the poly(aryl ether sulfones) include the following:
hydroquinone,
4,4-biphenol,
4,4'-dichlorodiphenyl sulfone,
4-chloro-4'-hydroxydiphenyl sulfone, and
4,4'-bis(4-chlorophenylsulfonyl)biphenyl.

The poly(aryl ether sulfones) are prepared by contacting substantially equimolar amounts of hydroxy containing compounds such as those listed above and halo and/or nitro containing compounds with from about 0.5 to about 1.0 mole of an alkali metal carbonate per mole of hydroxyl group in a solvent mixture comprising a solvent which forms an azeotrope with water in order to maintain the reaction medium at substantially anhydrous conditions during the polymerization.

The temperature of the reaction mixture is kept at from about 120° to about 180° C., for about 1 to about 5 hours and then raised and kept at from about 200° to about 250° C., preferably from about 210° to about 230° C., for about 1 to 10 hours.

The reaction is carried out in an inert atmosphere, e.g., nitrogen, at atmospheric pressure, although higher or lower pressures may also be used.

The poly(aryl ether sulfone) is then recovered by conventional techniques such as coagulation, solvent evaporation, and the like.

The solvent mixture comprises a solvent which forms an azeotrope with water and a polar aprotic solvent. The solvent which forms an azeotrope with water includes an aromatic hydrocarbon such as benzene, toluene, xylene, ethylbenzene, chlorobenzene, and the like.

The polar aprotic solvents employed in this invention are those generally known in the art for the manufacture of poly(aryl ether sulfones) and include sulfur containing solvents such as those of the formula:

$$R_1-S(O)_b-R_1$$

in which each $R_1$ represents a monovalent lower hydrocarbon group free of aliphatic unsaturation, which preferably contains less than about 8 carbon atoms or when connected together represents a divalent alkylene group with b being an integer from 1 to 2 inclusive. Thus, in all of these solvents all oxygens and two carbon atoms are bonded to the sulfur atom. Contemplated for use in this invention are such solvents as those having the formula:

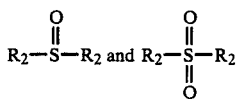

where the $R_2$ groups are independently lower alkyl, such as methyl, ethyl, propyl, butyl, and like groups, and aryl groups such as phenyl and alkylphenyl groups such as the tolyl groups, as well as those where the $R_6$ groups are interconnected as in a divalent alkylene bridge such as:

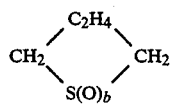

in tetrahydrothiophene oxides and dioxides. Specifically, these solvents include dimethylsulfoxide, dimethylsulfone, diphenylsulfone, diethylsulfoxide, diethylsulfone, diisopropylsulfone, tetrahydrothiophene 1,1-dioxide (commonly called tetramethylene sulfone or sulfolane) and tetrahydrothiophene-1 monoxide.

Additionally, nitrogen containing solvents may be used. These include dimethyl acetamide, dimethyl formamide and N-methylpyrrolidone.

The azeotrope forming solvent and polar aprotic solvent are used in a weight ratio of from about 10:1 to about 1:1, preferably from about 7:1 to about 5:1.

In the reaction, the hydroxy containing compound is slowly converted, in situ, to the alkali salt thereof by reacting with the alkali metal carbonate. The alkali metal carbonate is preferably potassium carbonate. Mixtures of carbonates such as potassium and sodium carbonate may also be used.

Water is continuously removed from the reaction mass as an azeotrope with the azeotrope forming solvent so that substantially anhydrous conditions are maintained during the polymerization.

It is essential that the reaction medium be maintained substantially anhydrous during the polycondensation. While amounts of water up to about one percent can be tolerated, and are somewhat beneficial when employed with fluorinated dihalobenzenoid compounds, amounts of water substantially greater than this are desirably avoided as the reaction of water with the halo and/or nitro compound leads to formation of phenolic species and only low molecular weight products are secured. Consequently, in order to secure the high polymers, the system should be substantially anhydrous, and preferably contain less than 0.5 percent by weight water during the reaction.

Preferably, after the desired molecular weight has been attained, the polymer is treated with an activated aromatic halide or an aliphatic halide such as methyl chloride or benzyl chloride, and the like. Such treatment of the polymer converts the terminal hydroxyl groups into ether groups which stabilize the polymer. The polymer so treated has good melt and oxidative stability.

The poly(aryl ether sulfone)s may be random or may have an ordered structure.

The poly(aryl ether sulfone)s of this invention have a reduced viscosity of from about 0.4 to greater than about 2.5, as measured in N-methylpyrolidone, or other suitable solvent, at 25° C.

The preferred poly(aryl ether sulfone)s are depicted by the following formulae:

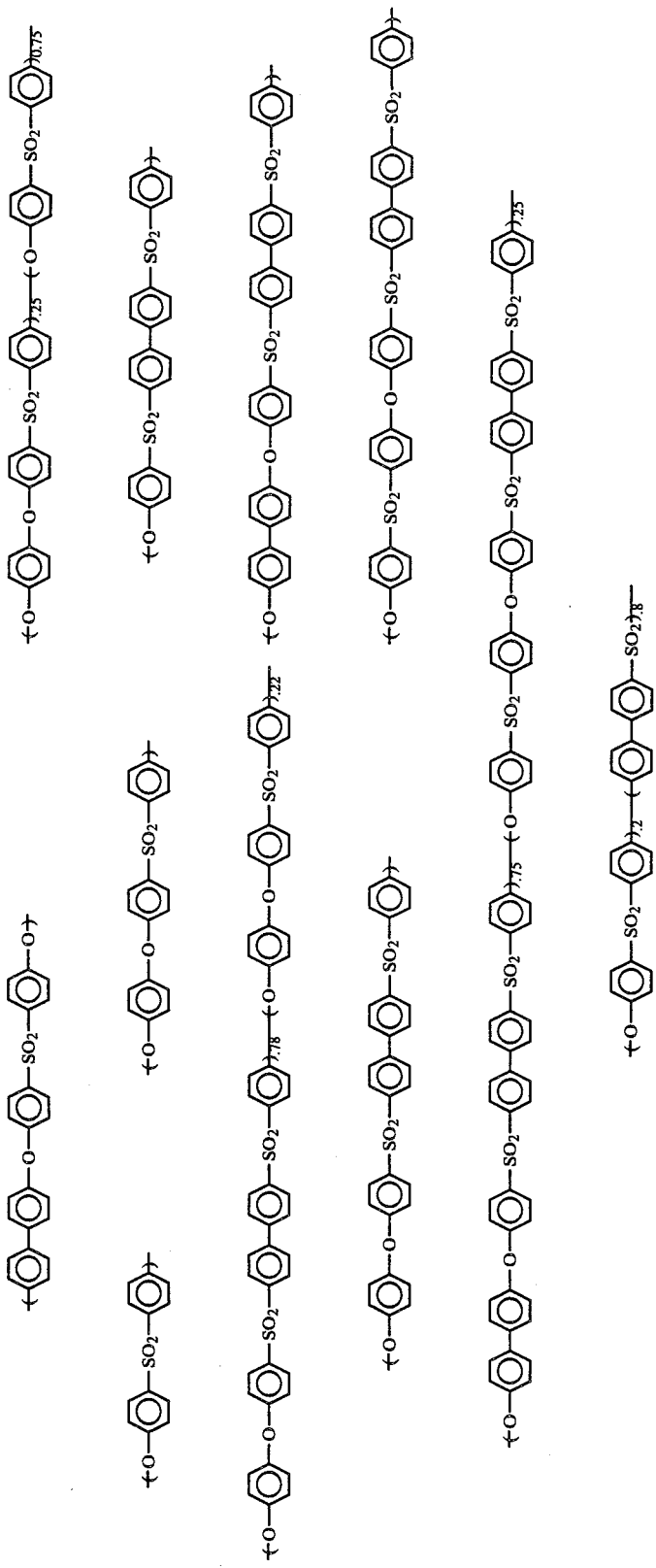

The blends of this invention are miscible in all proportions. Preferably the blend contains from about 2 to about 98, more preferably from about 15 to about 85 weight percent of each of the poly(aryl ether sulfones).

The blends of this invention are prepared by conventional mixing methods. For example, the poly(aryl ether sulfones) are mixed with each other and any other optional ingredients in powder or granular form in an extruder and the mixture is extruded into strands, the strands are chopped into pellets and the pellets molded into the desired article.

The blends of this invention may include mineral fillers such as carbonates, including chalk, calcite and dolomite; silicates, including mica, talc, wollastonite; silicon dioxide; glass spheres; glass powders; aluminum; clay; quartz; and the like. Also, reinforcing fibers such as fiberglass, carbon fibers, and the like may be used. The blends may also include additives such as titanium dioxide; thermal stabilizers such as zinc oxide; ultraviolet light stabilizers, plasticizers, and the like.

EXAMPLES

The following examples serve to give specific illustrations of the practice of this invention but they are not intended in any way to limit the scope of this invention.

The structures of the various poly(aryl ether sulfones) (PAEs) used herein are shown in Table I along with their reduced viscosities (RVs) and glass transition temperatures (Tgs). The Tgs were determined by the modulus-resilience method described in Olabisi, et al., ibid, p. 126–127. To accomplish this, each PAE was compression molded into a 4×4×0.020 inch plaque in a cavity mold using a South Bend hydraulic press with electrically heated plattens. Molding temperatures wre between 300° and 380° C. These plaques were shear cut into ⅛" wide test specimens. All PAEs except PAE V and IX were transparent as molded. All had single glass transition temperatures as noted.

TABLE I

| | Tg (°C.) | RV*(dl/g) | Mole Fraction Mers $X_1$ | $X_2$ | $X_3$ | Area Fraction Mers $\phi_1^i$ | $\phi_2^i$ | $\phi_3^i$ |
|---|---|---|---|---|---|---|---|---|
| PAE I | 220 | 0.63 in NMP | 0.50 | 0.25 | 0.25 | 0.46 | 0.32 | 0.21 |
| PAE II | 217 | 0.49 in chloroform | 0.56 | 0.44 | 0.0 | 0.47 | 0.53 | 0 |
| PAE III | 225 | 0.48 in NMP | 0.50 | 0.50 | 0.0 | 0.41 | 0.59 | 0 |
| PAE IV | 195 | 0.48–0.60 in NMP | 0.67 | 0.33 | 0.0 | 0.59 | 0.41 | 0 |
| PAE V | 282 | 0.55 in NMP | 0.25 | 0.50 | 0.25 | 0.21 | 0.59 | 0.20 |
| PAE VI | 245 | 0.56 in NMP | 0.44 | 0.39 | 0.17 | 0.38 | 0.47 | 0.14 |
| PAE VII | 265–270 | 0.51 in NMP | 0.33 | 0.33 | 0.33 | 0.30 | 0.42 | 0.28 |
| PAE VIII | 245–250 | 0.48 in NMP | 0.40 | 0.40 | 0.20 | 0.35 | 0.49 | 0.16 |
| PAE IX | 265 | 0.70 in NMP | 0.33 | 0.50 | 0.17 | 0.28 | 0.59 | 0.13 |
| PAE X | 260 | 0.43–0.66 in NMP | 0.33 | 0.38 | 0.29 | 0.29 | 0.47 | 0.24 |
| PAE XI | 310 | 0.72 in NMP | 0.1 | 0.5 | 0.4 | 0.08 | 0.60 | 0.32 |

*Reduced viscosities measured at 25° C. at a concentration of 0.2 g/100 ml.
NMP = 1 = methyl-2-pyrrolidone.

CONTROL A 50 parts by weight PAE I was mixed with 50 parts by weight PAE II in a Brabender Plasticorder blender at about 350° C. The blends were molded into 4×4×0.020 inch plaques and measured for glass transition temperatures as described above. The resulting blend was opaque. The Tgs of the constituents were too similar to distinguish separately in the blend. On this basis, the blend was judged to be immiscible.

CONTROL B 50 parts by weight PAE I was mixed with 50 parts by weight PAE III in a Brabender Plasticorder blender at about 350° C. The blends were molded into 4×4×0.020 inch plaques and measured for glass transition tempeatures as described above. The resulting blend was opaque. The Tgs of the constituents were too similar to distinguish separately in the blend. On this basis, the blend was judged to be immiscible.

EXAMPLE 1

50 parts by weight PAE I was mixed with 50 parts by weight PAE IV in a Brabender Plasticorder blender at about 350° C. The blends were molded into 4×4×0.020 inch plaques and measured for glass transition temperatures as described above. The resulting blend was transparent and has a single glass transition temperature of 207° C. On this basis, the blend was judged to be miscible.

EXAMPLE C 50 parts by weight PAE I was mixed with 50 parts by weight PAE V in a Brabender Plasticorder blender at about 350° C. The blends were molded into 4×4×0.020 inch plaques and measured for glass transition temperatures as described above. The resulting blend was opaque and had two glass transition temperatures of 215° and 280° C. On this basis, the blend was judged to be immiscible.

EXAMPLE 2

50 parts by weight PAE I was mixed with 50 parts by weight PAE VII in a Brabender Plasticorder blender at about 350° C. The blends were molded into 4×4×0.020 inch plaques and measured for glass transition temperatures as described above. The resulting blend was transparent and had a single glass transition temperature of 225° C. On this basis, the blend was judged to be miscible.

EXAMPLE 3

50 parts by weight PAE II was mixed with 50 parts by weight PAE V in a Brabender Plasticorder blender at about 350° C. The blends were molded into 4×4×0.020 inch plaques and measured for glass transition temperatures as described above. The resulting blend had a single glass transition temperature of 245° C. On this basis, the blend was judged to be miscible.

EXAMPLE D 50 parts by weight PAE II was mixed with 50 parts by weight PAE II in a Brabender Plasticorder blender at about 350° C. The blends were molded into 4×4×0.020 inch plaques and measured for glass transition temperatures as described above. The resulting blend was opaque and had two glass transition temperatures of 225° and 260° C. On this basis, the blend was judged to be immiscible.

EXAMPLE 4

50 parts by weight PAE II was mixed with 50 parts by weight PAE X in a Brabender Plasticorder blender at about 350° C. The blends were molded into 4×4×0.020 inch plaques and measured for glass transition temperatures as described above. The resulting blend was transparent and had a single glass transition temperature of 235° C. On this basis, the blend was judged to be miscible.

EXAMPLE 5

50 parts by weight PAE II was mixed with 50 parts by weight PAE IV in a Brabender Plasticorder blender at about 350° C. The blends were molded into 4×4×0.020 inch plaques and measured for glass transition temperatures as described above. The resulting blend was transparent and had a single glass transition temperature of 200° C. On this basis, the blend was judged to be miscible.

EXAMPLE 6

50 parts by weight PAE III was mixed with 50 parts by weight PAE V in a Brabender Plasticorder blender at about 350° C. The blends were molded into 4×4×0.020 inch plaques and measured for glass transition temperatures as described above. The resulting blend was transparent and had a single glass transition temperature of 245° C. On this basis, the blend was judged to be miscible.

EXAMPLE 7

50 parts by weight PAE III was mixed with 50 parts by weight PAE VI in a Brabender Plasticorder blender at about 350° C. The blends were molded into 4×4×0.020 inch plaques and measured for glass transition temperatures as described above. The resulting blend was transparent and had a single glass transition temperature of 235° C. On this basis, the blend was judged to be miscible.

CONTROL E 50 parts by weight PAE IV was mixed with 50 parts by weight PAE V in a Brabender Plasticorder blender at about 350° C. The blends were molded into 4×4×0.020 inch plaques and measured for glass transition temperatures of 200° and 275° C. On this basis, the blend was judged to be immiscible.

EXAMPLE 8

50 parts by weight PAE IV was mixed with 50 parts by weight PAE VII in a Brabender Plasticorder blender at about 350° C. The blends were molded into 4×4×0.020 inch plaques and measured for glass transition temperatures as described above. The resulting blend was transparent and had a single, broad glass transition temperature between 230° C. and 245° C. On this basis, the blend was judged to be partially miscible.

EXAMPLE 9

50 parts by weight PAE II was mixed with 50 parts by weight PAE VIII in a Brabender Plasticorder blender at about 350° C. The blends were molded into 4×4×0.020 inch plaques and measured for glass transition temperatures as described above. The resulting blend was transparent and had a single, broad glass transition temperature of 235° C. On this basis, the blend was judged to be miscible.

CONTROL F 50 parts by weight PAE IV was mixed with 50 parts by weight PAE IX in a Brabender Plasticorder blender at about 350° C. The blends were molded into 4×4×0.020 inch plaques and measured for glass transition temperature as described above. The resulting blend was opaque and had two glass transition temperatures of 190° and 265° C. On this basis, the blend was judged to be immiscible.

EXAMPLE 10

2.5 grams of PAE II and 2.5 grams of PAE IX were codissolved in N,N-dimethylacetamide at room temperature to make about a 10% polymer solution. The mixture was then poured into a petri dish and the solution. The mixture was then poured into a petri dish and the solvent evaporation off under vacuum at 150° C. for 16 hours. The resulting film was then boiled in water for 4 hours to remove the last traces of solvent and then heated to a circulating air oven at 250° C. for 16 hours. The Tg of the film was measured by the modulus resilience method. The film exhibited a single glass transition temperature of 240° C., and was therefore judged to be miscible.

EXAMPLE 11

2.5 grams of PAE III and 2.5 grams of PAE IX were codissolved in N,N-dimethylacetamide at room temperature to make about a 10% polymer solution. The mixture was then poured into a petri dish and the solvent evaporated off under vacuum at 150° C. for 16 hours. The resulting film was then boiled in water for 4 hours to remove the last traces of solvent and then heated in a circulating air oven at 250° C. for 16 hours. The Tg of the film was measured by the modulus resilience method. The film exhibited a single glass transition temperature of 245° C., and was therefore judged to be miscible.

CONTROL G

One gram of PAE II and one gram of PAE XI were codissolved in N,N-dimethylacetamide at room temperature to make about a 10% polymer solution. The mixture was then poured into a petri dish and the solvent evaporated off under vacuum at 150° C. for 16 hours. The resulting film was then boiled in water for 4 hours to remove the last traces of solvent and then heated in a circulating air oven at 250° C. for 16 hours. The Tg of the film was measured by the modulus resilience method. The film exhibited two distinct glass transition temperatures of 225° and 290° C., and was therefore judged to be immiscible.

CONTROL H

One gram of PAE III and one gram of PAE XI were codissolved in N,N-dimethylacetamide at room temperature to make about a 10% polymer solution. The mixture was then poured into a petri dish and the solvent evaporated off under vacuum at 150° C. for 4 hours. The resulting film was then boiled in water for 4 hours to remove the last traces of solvent and then heated in a circulating air oven at 250° C. for 16 hours. The Tg of the film was measured using a DuPont Model 990 Thermal Analyzer equipped with a DSC pressure cell by methods well known in the art (See Olabisi, et al., ibid., pp. 133-134). The film exhibited two distinct glass transition temperatures of 231° and 258° C., and was therefore judged to be immiscible.

EXAMPLE 12

70 parts by weight of PAE I was mixed with 30 parts by weight of PAE X in a Brabender Plasticorder blender at about 350° C. The blend was compression molded into a 4×4×0.010 inch plaque at about 350° C. The Tg of the plaque was measured by the modulus resilience method as was 225° C. Based on the existence of a single Tg and its transparency, this blend was judged to be miscible.

CONTROL I 50 parts by weight of PAE I was mixed with 50 parts by weight of PAE IX in a Brabender Plasticorder blender at about 350° C. The blends were molded into 4×4×0.020 inch plaques and measured for glass transition temperatures as described above. The resulting blend was opaque and had two glass transition tempeatures of 220° and 260° C. On this basis, the blend was judged to be immiscible.

EXAMPLES 13—15

In order to demonstrate miscibility over the entire composition range, 25/75, 50/50, and 75/25 parts by weight PAE II/PAE V blends were made in a Brabender Plasticorder blender at about 350° C. The blends were compression molded into 4×4×0.010 inch plaques at about 350° C. and their Tgs measured by the modulus resilience method. All blends had a single Tg which varied with composition.

DISCUSSION OF RESULTS

The findings of the Examples and Controls are summarized in Table II. It is clear by varying the structure of the polymers in these blends that miscibility can be attained in many instances. Equation (1) will be employed in order to correlate the occurrence of miscibility with the structure of polymers 1 and 2 in the blend. The $\phi_i{}^K$ are taken to be the molecular area fraction of mer i in polymer K. The three mers optionally present in each polymer are taken to be the following:

| Mer | | Relative Surface Area |
|---|---|---|
| (1) | 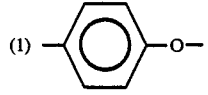 | 1 |
| (2) | 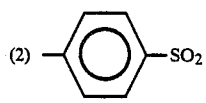 | 1.415 |
| (3) | 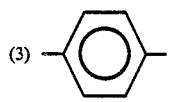 | 0.927 |

Their relative molecular surface areas were estimated as above using the scheme set forth by D. Bondi in the Physical Properties of Molecular Liquids, Glasses and Crystals, Chapter 14. $F_c$ was arbitrarily chosen as unity and the three $B_{ij}$ were adjusted such that the experimental results given in Table II were all correctly correlated. The choice of the three $B_{ij}$ were critical in correctly correlating all the examples given in Table II. The values of the $B_{ij}$ arrived at are:

$B_{12} = 25.2$
$B_{13} = 14.3$
$B_{23} = 32.8$

Substitution of the relative surface areas of the mers and the $B_{ij}$'s given above into equation (1) results in equation (4) repeated here:

$$(\phi_1^1\phi_2^2 + \phi_1^2\phi_2^1 - \phi_1^1\phi_2^1 - \phi_1^2\phi_2^2)25.2 + \qquad (4)$$
$$(\phi_1^1\phi_3^2 + \phi_1^2\phi_3^1 - \phi_1^1\phi_3^1 - \phi_1^2\phi_3^2)14.3 +$$
$$(\phi_2^1\phi_3^2 + \phi_2^2\phi_3^1 - \phi_2^1\phi_3^1 - \phi_2^2\phi_3^2)32.8 \leqq 1$$

where $$\phi_1^1 = \frac{X_1}{X_1 + 1.415X_2 + 0.927X_3}$$

$$\phi_1^2 = \frac{Y_1}{Y_1 + 1.415Y_2 + 0.927Y_3}$$

$$\phi_2^1 = \frac{1.415X_2}{X_1 + 1.415X_2 + 0.927X_3}$$

$$\phi_2^2 = \frac{1.415Y_2}{Y_1 + 1.415Y_2 + 0.927Y_3}$$

$$\phi_3^1 = \frac{0.927X_3}{X_1 + 1.415X_2 + 0.927X_3}$$

$$\phi_3^2 = \frac{0.927Y_3}{Y_1 + 1.415Y_2 + 0.927Y_3}$$

$X_1$ is the molar fraction of

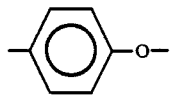

radicals in polyarylether sulfone 1
$X_2$ is the molar fraction of

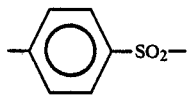

radicals in polyarylether sulfone 1
$X_3$ is the molar fraction of

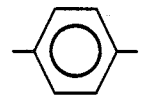

radicals in polyarylether sulfone 1
$Y_1$ is the molar fraction of

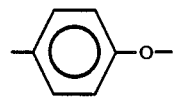

radicals in polyarylether sulfone 2
$Y_2$ is the molar fraction of

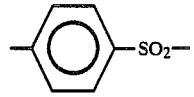

radicals in polyarylether sulfone 2
$Y_3$ is the molar fraction of

radicals in polyarylether sulfone 2

Equation 4 was evaluated for the polymer pairs corresponding to the Examples and Controls and the results are given in Table III. In each case Equation (4) correctly predicts the phase behavior of the PAE pairs.

Another way of viewing Equation (4) is to specify the composition of the polymer 1. This fixes $\phi_1^1$, $\phi_2^1$, and $\phi_3^1$. The region of miscibility then specified by Equation (4) can be depicted graphically. For example, if polymer 1 is specified to be PAE I, $\phi_1^1$, $\phi_2^1$, and $\phi_3^1$ can be inserted into Equation (4) from Table I. Upon simplification, Equation (4) becomes:

$$11.3\phi_1^2 + 18.5\phi_2^2 + 17.4\phi_3^2 - 25.2\phi_1^2\phi_2^2 - 14.3\phi_1^2\phi_3^2 - 32.8\phi_2^2\phi_3^2 - 7.5 \leqq 1 \qquad (5)$$

Figure 3:
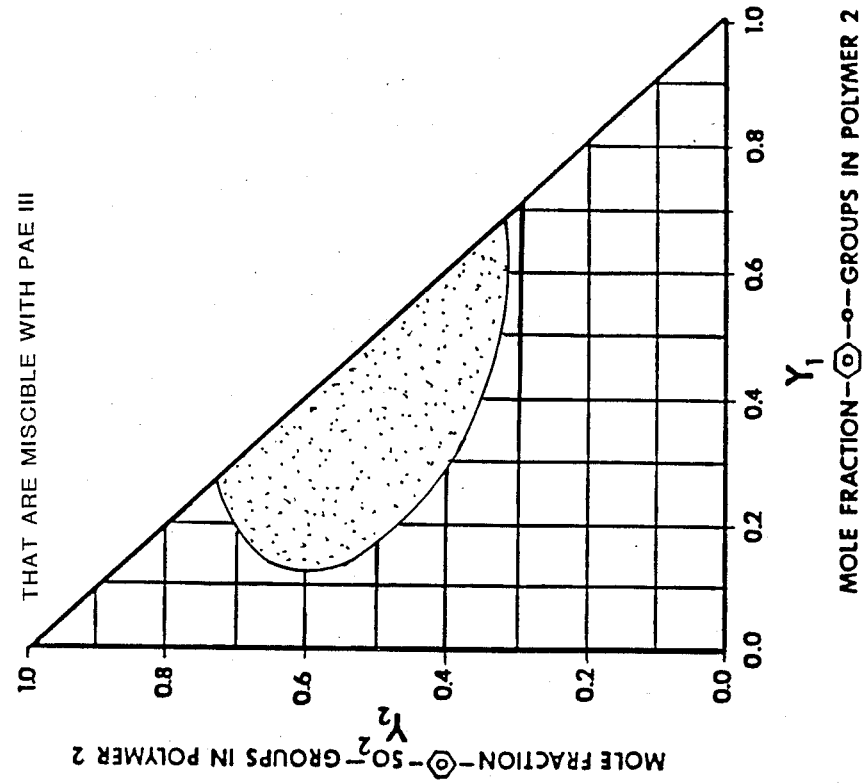
Figure 4:
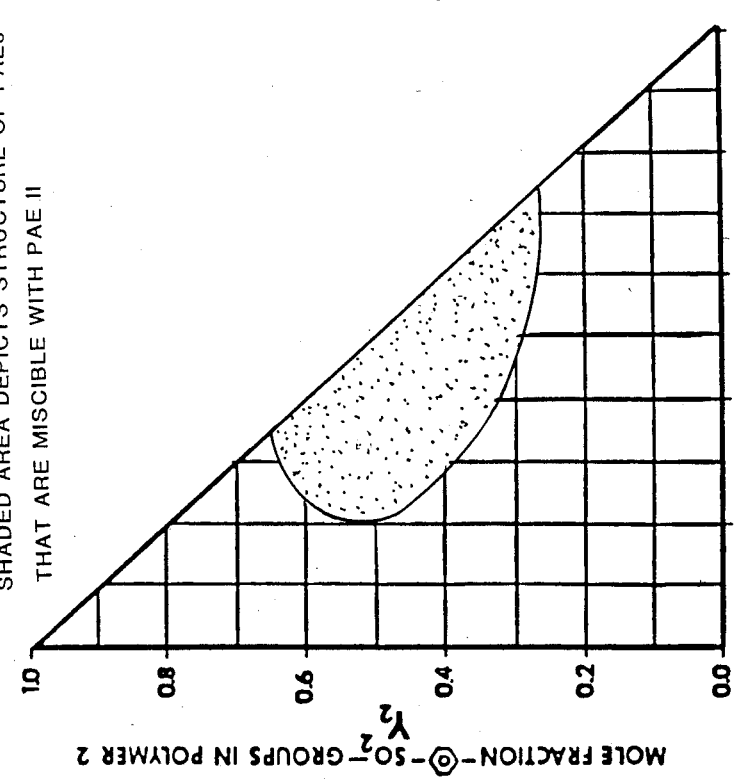
Figure 5:
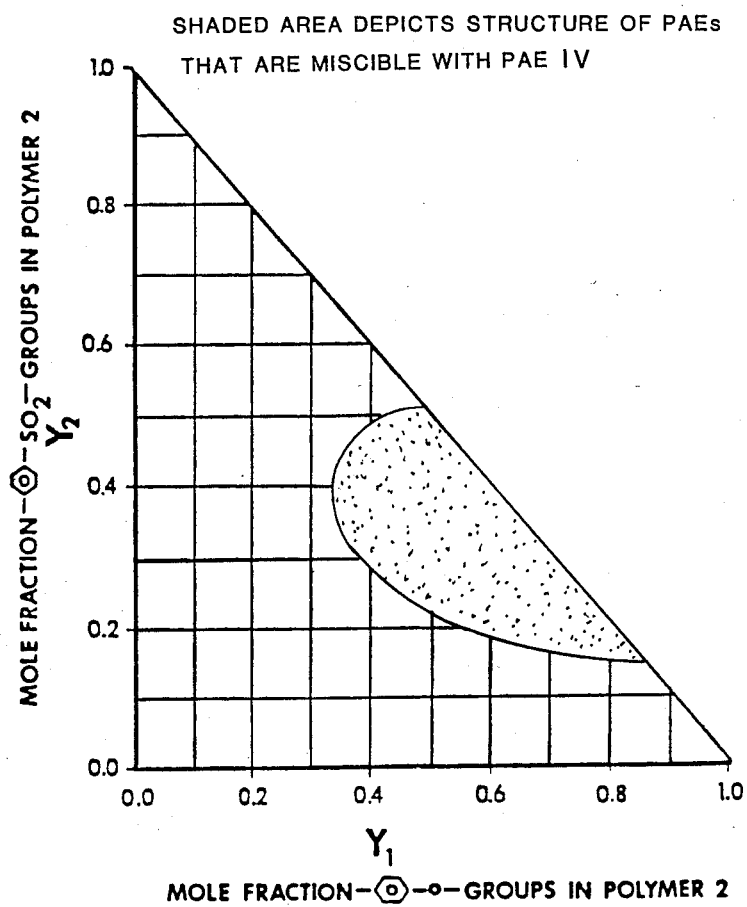

Since $\phi_1^2$, $\phi_2^2$, and $\phi_3^2$ are functions of $Y_1$, $Y_2$, and $Y_3$ which specify the composition of polymer 2, and since $Y_1 + Y_2 + Y_3 = 1$, Equation (5) may be plotted versus $Y_2$ and $Y_2$ as shown in FIG. 2. The shaded portion of FIG. 2 depicts the region specified by equation (4) when polymer 1 is PAE I and polymer 2 contains groups (I), (II) and (III), and in any ratio. Likewise the shaded portions of FIGS. 3, 4, and 5 depict the region specified by equation (4) when polymer 1 is PAE II, III, and IV, respectively.

TABLE II

| | Miscibility of Various PAEs | | | | | | | | | | |
|---|---|---|---|---|---|---|---|---|---|---|---|
| | PAE I | PAE II | PAE III | PAE IV | PAE V | PAE VI | PAE VII | PAE VIII | PAE IX | PAE X | PAE XI |
| PAE I | | I | I | M | I | | M | | I | M | |
| PAE II | | | | | M | | I | M | M | M | I |
| PAE III | | | | M | M | M | | | M | | I |
| PAE IV | | | | | I | | M | | I | | |

TABLE II-continued

Miscibility of Various PAEs

| | PAE I | PAE II | PAE III | PAE IV | PAE V | PAE VI | PAE VII | PAE VIII | PAE IX | PAE X | PAE XI |
|---|---|---|---|---|---|---|---|---|---|---|---|
| IV | | | | | | | | | | | |

M = miscible
I = immiscible

TABLE III

| Example | Left Hand Side of Equation (3) | Equation (3) Satisfied (Yes or No) | Interpretation |
|---|---|---|---|
| 1 | 1.42 | no | immiscible |
| 2 | 1.99 | no | immiscible |
| 3 | 0.72 | yes | miscible |
| 4 | 1.81 | no | immiscible |
| 5 | 0.34 | yes | miscible |
| 6 | 0.73 | yes | miscible |
| 7 | 1.19 | no | immscible |
| 8 | 0.81 | yes | miscible |
| 9 | 0.75 | yes | miscible |
| 10 | 0.56 | yes | miscible |
| 11 | 0.45 | yes | miscible |
| 12 | 1.61 | no | miscible |
| 13 | 1.12 | no | partially miscible |
| 14 | 0.37 | yes | miscible |
| 15 | 1.20 | no | immiscible |
| 16 | 0.39 | yes | miscible |
| 17 | 0.25 | yes | miscible |
| 18 | 1.69 | no | immiscible |
| 19 | 1.45 | no | immiscible |
| 20 | 0.55 | yes | miscible |
| 21 | 0.73 | no | immiscible |

We claim:

1. A miscible blend of two or more different poly(aryl ether sulfones) consisting essentially of at least one unit selected from the group consisting of:

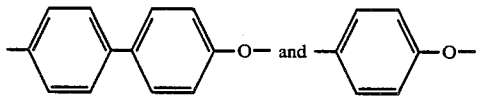

and at least one unit selected from the group consisting of:

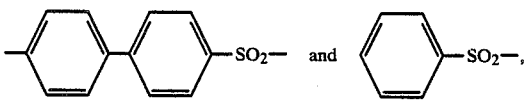

wherein at least one of said poly(aryl ether sulfone) comprises at least one member selected from the group consisting of:

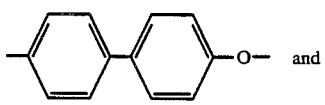

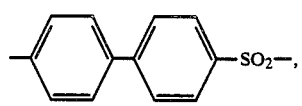

the poly(aryl ether sulfones) being different and each comprises the following radicals:

(I) — a p-phenylene–O– radical (II) — a p-phenylene–SO$_2$– radical, and (III) — a p-phenylene radical.

2. The miscible blend of poly(aryl ether sulfones) of claim 1 wherein the region of miscibility of the different poly(aryl ether sulfones) in each other is specified by the following equation:

$$(\phi_1^1\phi_2^2 + \phi_1^2\phi_2^1 - \phi_1^1\phi_2^1 - \phi_1^2\phi_2^2)25.2 +$$
$$(\phi_1^1\phi_3^2 + \phi_1^2\phi_3^1 - \phi_1^1\phi_3^1 - \phi_1^2\phi_3^2)14.3 +$$
$$(\phi_2^1\phi_3^2 + \phi_2^2\phi_3^1 - \phi_2^1\phi_3^1 - \phi_2^2\phi_3^2)32.8 \leq 1$$

Where $$\phi_1^1 = \frac{X_1}{X_1 + 1.415X_2 + 0.927X_3}$$

$$\phi_1^2 = \frac{Y_1}{Y_1 + 1.415Y_2 + 0.927Y_3}$$

$$\phi_2^1 = \frac{1.415X_2}{X_1 + 1.415X_2 + 0.927X_3}$$

$$\phi_2^2 = \frac{1.415Y_2}{Y_1 + 1.415Y_2 + 0.927Y_3}$$

$$\phi_3^1 = \frac{0.927X_3}{X_1 + 1.415X_2 + 0.927X_3}$$

$$\phi_3^2 = \frac{0.927Y_3}{Y_1 + 1.415Y_2 + 0.927Y_3}$$

$X_1$ is the molar fraction of

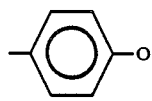

radicals in polyarylether sulfone 1
$X_2$ is the molar ratio of

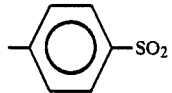

radicals in polyarylether sulfone 1

$X_3$ is the molar fraction of

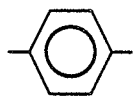

radicals in polyarylether sulfone 1

$Y_1$ is the molar fraction of

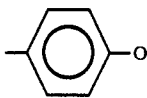

radicals in polyarylether sulfone 2

$Y_2$ is the molar fraction of

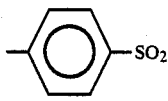

radicals in polyarylether sulfone 2

$Y_3$ is the molar fraction of

radicals in polyarylether sulfone 2.

3. A miscible blend as defined in claim 2 wherein the poly(aryl ether sulfones) are selected from a poly(ethyl ether sulfone) having the following repeating unit:

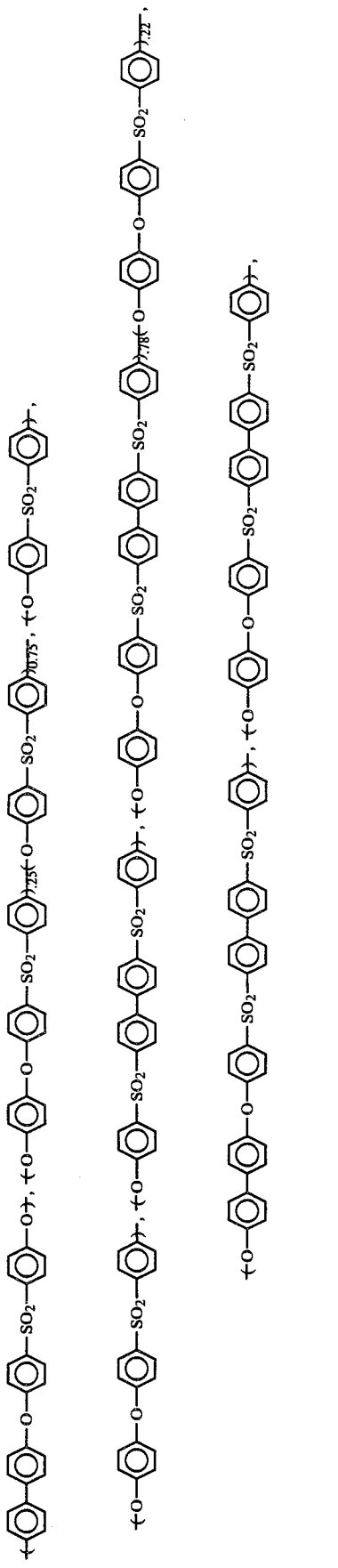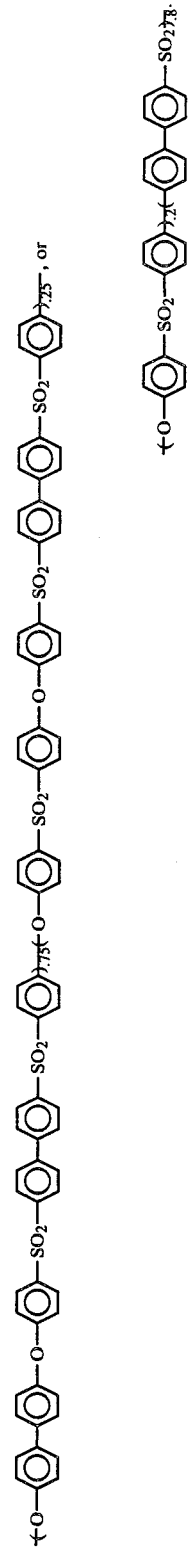

4. A miscible blend containing two different poly(aryl ether sulfone) polymers A and B, said polymers having the following repeating units:

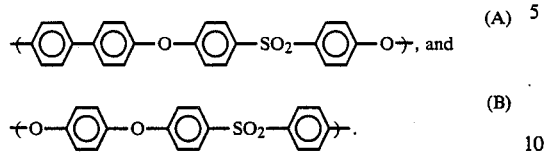

5. A miscible blend containing two different poly(aryl ether sulfone) polymers A and B, said polymers having the following repeating units:

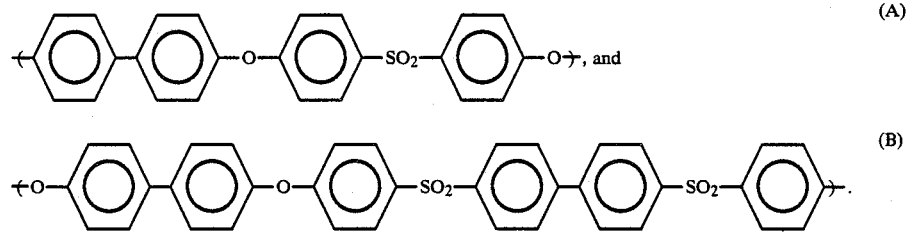

6. A miscible blend containing two different poly(aryl ether sulfone) polymers A and B, said polymers having the following repeating units:

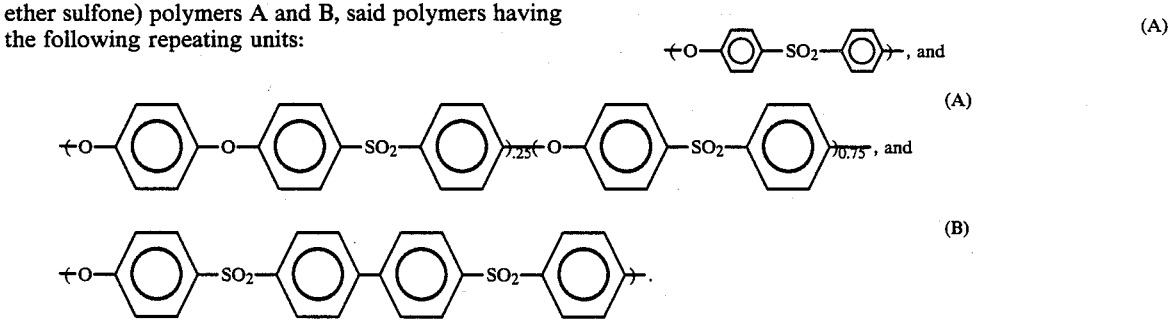

7. A miscible blend containing two different poly(aryl ether sulfone) polymers A and B, said polymers having the following repeating units:

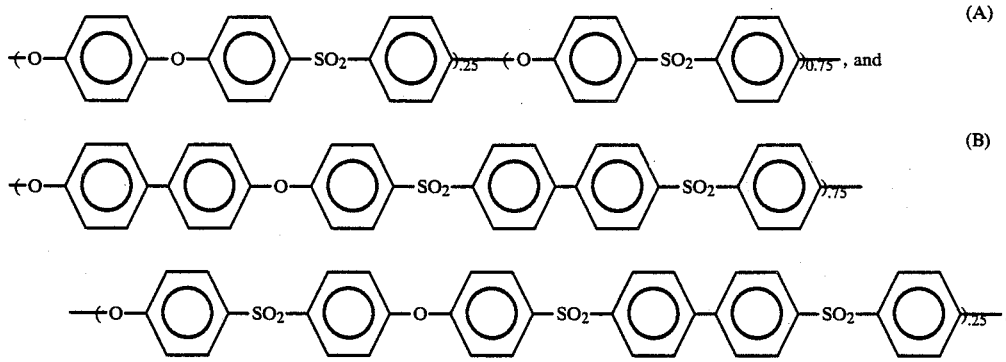

8. A miscible blend containing two different poly(aryl ether sulfone) polymers A and B, said polymers having the following repeating units:

9. A miscible blend containing two different poly(aryl ether sulfone) polymers A and B, said polymers having the following repeating units:

10. A miscible blend containing two different poly(aryl ether sulfone) polymers A and B, said polymers having the following repeating units:

(B)

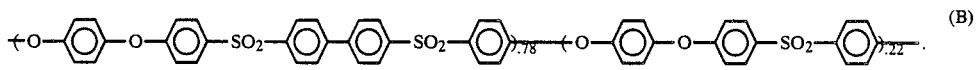

11. A miscible blend containing two different poly(aryl ether sulfone) polymers A and B, said polymers having the following repeating units:

(A)

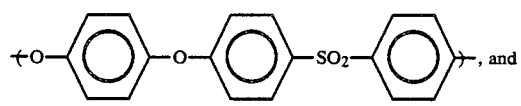, and (B)

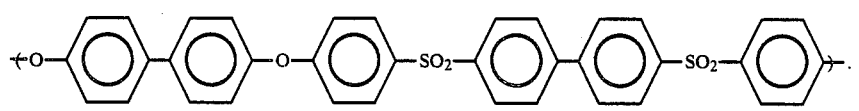.

13. A miscible blend containing two different poly(aryl ether sulfone) polymers A and B, said polymers having the following repeating units:

(A)

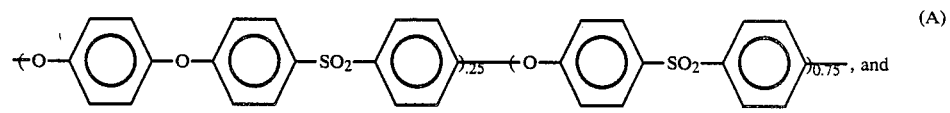, and (B)

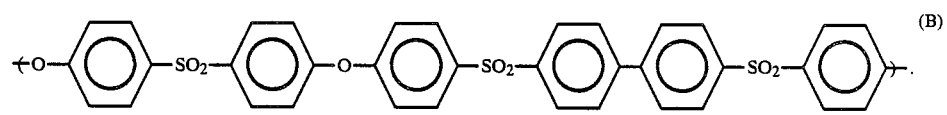.

12. A miscible blend containing two different poly(aryl ether sulfone) polymers A and B, said polymers having the following repeating units:

(A)

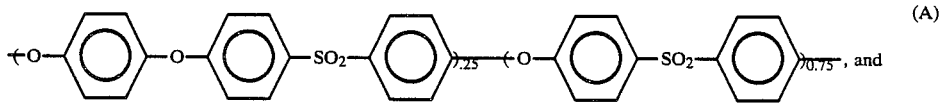, and (B)

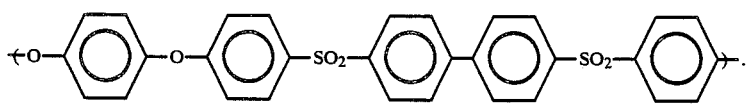.

14. A miscible blend containing two different poly(aryl ether sulfone) polymers A and B, said polymers having the following repeating units:

(A)

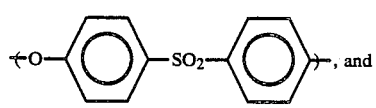, and (B)

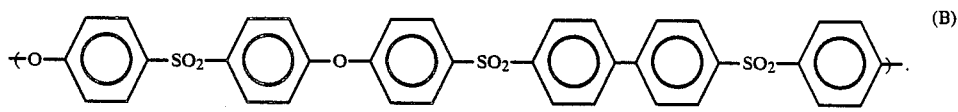.

15. A miscible blend containing two different poly(aryl ether sulfone) polymers A and B, said polymers having the following repeating units:

(A)

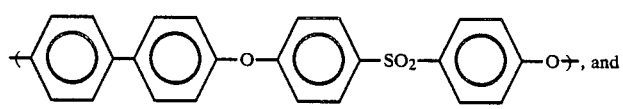, and

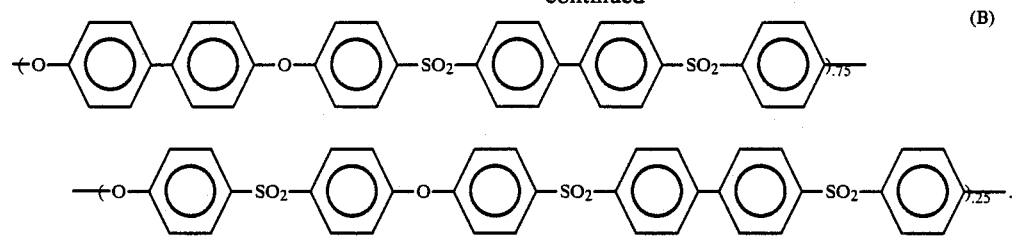

UNITED STATES PATENT OFFICE
CERTIFICATE OF CORRECTION

Patent No. 4,804,723  Dated February 14, 1989

Inventor(s) James E. Harris, Lloyd M. Robeson

It is certified that error appears in the above-identified patent and that said Letters Patent is hereby corrected as shown below:

| Column | Line |  |
|--------|------|--|
| 17 | 64 | "II" should read --VII-- |
| 18 | 15 | "II" should read --III-- |
| 19 | 17&18 | "The mixture... solution." should be deleted |
| 26 | 26 | "(ethyl" should read --(aryl-- |

Signed and Sealed this

Fifteenth Day of August, 1989

Attest:

DONALD J. QUIGG

Attesting Officer   Commissioner of Patents and Trademarks